(12) United States Patent
Hayashi et al.

(10) Patent No.: US 6,302,316 B1
(45) Date of Patent: Oct. 16, 2001

(54) BALL ARRANGEMENT METHOD AND ARRANGEMENT APPARATUS

(75) Inventors: Nobuaki Hayashi, Tokyo; Junichi Ujita, Saitama, both of (JP)

(73) Assignee: Nippon Micrometal Co., Ltd., Saitama (JP)

( * ) Notice: Subject to any disclaimer, the term of this patent is extended or adjusted under 35 U.S.C. 154(b) by 0 days.

(21) Appl. No.: 09/475,211

(22) Filed: Dec. 29, 1999

(30) Foreign Application Priority Data

Jan. 27, 1999 (JP) .................................................. 11-18341

(51) Int. Cl.⁷ .............................. B23K 1/20; B23K 31/02
(52) U.S. Cl. ...................... 228/223; 228/248.1; 228/254; 228/36
(58) Field of Search ............................ 228/180.22, 207, 228/223, 248.1, 248.5, 254, 33, 36, 37, 40

(56) References Cited

U.S. PATENT DOCUMENTS

| | | | |
|---|---|---|---|
| 5,088,639 | * | 2/1992 | Gondotra et al. . |
| 5,279,045 | * | 1/1994 | Odashima et al. . |
| 5,284,287 | | 2/1994 | Wilson et al. . |
| 5,467,913 | * | 11/1995 | Namekawa et al. . |
| 5,626,277 | * | 5/1997 | Kawada . |
| 5,768,775 | * | 6/1998 | Nakazato . |
| 5,788,143 | * | 8/1998 | Boyd et al. . |
| 5,831,247 | * | 11/1998 | Hidaka . |
| 5,890,283 | * | 4/1999 | Sakemi et al. . |
| 6,099,681 | * | 8/2000 | Arikado et al. . |
| 6,146,920 | * | 11/2000 | Inoue et al. . |
| 6,189,771 | * | 2/2001 | Maeda et al. . |
| 6,193,143 | * | 2/2001 | Ishikawa . |

FOREIGN PATENT DOCUMENTS

| | | | |
|---|---|---|---|
| 408153960A | * | 6/1996 | (JP) . |
| 8-335771 | | 12/1996 | (JP) . |
| 8-340175 | | 12/1996 | (JP) . |
| 409232799A | * | 9/1997 | (JP) . |
| 409270442A | * | 10/1997 | (JP) . |
| 10-58135 | | 3/1998 | (JP) . |
| 10-270449 | | 10/1998 | (JP) . |
| 411054561A | * | 2/1999 | (JP) . |

* cited by examiner

Primary Examiner—Tom Dunn
Assistant Examiner—Kiley Stoner
(74) Attorney, Agent, or Firm—Wenderoth, Lind & Ponack, L.L.P.

(57) ABSTRACT

A ball arrangement method and arrangement apparatus for simultaneously mounting balls on a mounting object by the steps of holding the balls by suction on ball suction holes in a ball arrangement device having the ball suction holes arranged, transcribing flux or a solder paste onto the balls held by suction, and transferring the balls onto the mounting object. In the method and apparatus, a flux supplying unit composed of a head plate 5 at an end thereof is provided, flux supplying nozzles 7 are arranged over the head plate 5 at positions corresponding to the ball suction holes 6 in the ball arrangement device 1. The flux or the solder paste is transcribed onto surfaces of the balls in such a manner that the flux or the solder paste is filled into the flux supplying nozzles 7 by supplying the flux or the solder paste from the back of the head plate 5, and then the balls held by suction on the ball suction holes in the ball arrangement device are brought into contact with the flux supplying nozzles being filled with the flux or the solder paste. The method and apparatus are capable of transcribing flux even onto fine balls below 150 μm in diameter without producing a change in properties of the flux and polluting the periphery of the apparatus with the flux.

15 Claims, 3 Drawing Sheets

BALL ARRANGEMENT METHOD AND
ARRANGEMENT APPARATUS

BACKGROUND OF THE INVENTION

1. Field of the Invention

The invention relates to a method and apparatus for arranging balls onto a mounting object, and more particularly to a method and apparatus for arranging solder balls as ball bumps onto electrodes on semiconductor chips, electrodes on IC-chip-mounted substrates, or electrodes of semiconductor devices.

2. Description of the Related Art

As junction media between electrodes of a semiconductor chip and a circuit board, fine balls (bumps) are used. Besides, techniques of transferring fine balls onto semiconductor chips, substrates of IC chips, or the like to form bumps in a ball grid array (BGA) have been increasing their importance. Here, such semiconductor chips and substrates of IC chips to have the balls transferred on are referred to collectively as mounting objects. As the bumps, solder balls and gold balls are used. In the cases of using solder balls as the bumps, the solder balls are arranged on the surface of a mounting object at positions where the bumps are to be formed, and then heat is applied to deposit the solder balls to the mounting object. To carry out the deposition, flux or a solder paste (hereinafter, referred to collectively as "flux") needs to be applied between the mounting object and the respective solder balls.

To simultaneously transfer a number of balls onto a mounting object, a technique is known in which the balls are held by suction on a ball arrangement device before the balls are transferred from the ball arrangement device to the mounting object. The ball arrangement device has ball suction holes for holding the balls by suction. The positions of the respective ball suction holes correspond to positions over the mounting object onto which the balls are to be transferred. The balls are held by suction on all the ball suction holes in advance, and the ball arrangement device holding the balls by suction is then conveyed to a mounting base. On the mounting base, the mounting object to receive transferred balls is placed in advance. The balls can be transferred by pressing the balls held by suction on the ball arrangement device against the surface of the mounting object being placed on the mounting base.

In the cases of using solder balls, flux needs to be applied between the mounting object and the respective balls. Methods for applying flux include a method of applying the flux onto the surface of the mounting object at the positions to receive the transferred balls in advance of the transfer of the balls, and a method of applying the flux onto the surfaces of the balls held on the ball arrangement device.

As a first method of applying the flux onto the surface of the mounting object, a flux printing method by using a mask is known. As the mask, a metal mask or a mesh mask is used. The mask has opening portions, which are provided at positions corresponding to the positions on the surface of the mounting object where the flux is to be applied. The mounting object is covered with the mask, the flux is applied from above the mask, and then the mask is removed to obtain the mounting object having flux transcribed on predetermined portions.

The above-described method of using a mask, which is a method in wide use conventionally, has regularity in the amount of transcribed flux. The method, however, has drawbacks in that flux to be supplied to the opening portions of the mask involves bubbles, and in that excessive flux gets into a backside of the mask (the side being in contact with the mounting object) to pollute the backside of the mask, thereby the surface of the mounting object is polluted with the flux. Once such troubles occur, it is also difficult to clean up only the backside of the mask. In the method of using a mask, no additional problem occurs as long as the surface of a mounting object is flat; however, in the cases where the surface of a mounting object is uneven, it becomes impossible to put a mask into close contact with the surface, so that the transfer of flux will not be carried out normally.

As a second method of applying flux onto the surface of a mounting object, a method is known in which pins corresponding in number to the number of the balls to be transferred are arranged like a pinholder, flux is applied onto the extremities of the pins, and then the respective extremities of the pins are brought into contact with the mounting object so that the flux is transferred from the extremities of the pins to the mounting object for application.

In the above-described method of using pins, flux adhering and remaining on the extremities of the pins after the transfer causes a fluctuation in the amount of flux to be transcribed onto the extremities of the pins at the next transfer, giving rise to a problem of deteriorating the stability in the amount of transcribed flux. Besides, another problem consists in that a rise in the number of solder balls to be mounted on a mounting object increases the complexity and the cost of the pin device.

As the method of transcribing flux onto the surfaces of the balls held on the ball arrangement device, a method is known in which flux is applied on a flat plate and thinly spread to a prescribed thickness with a squeegee or the like before the balls on the ball arrangement device are brought into contact with the flux application film on the flat plate to transcribe the flux onto the surfaces of the balls. Thereafter, the balls are transferred from the ball arrangement device onto a mounting object. As a result, the flux is transcribed between the balls and the mounting object to mount the balls.

In the above-described method of transcribing flux onto the surfaces of the balls held on the ball arrangement device, when flux is spread and applied over the flat plate with a squeegee or the like having some flux adhering thereon, the resultant applied flux becomes uneven in thickness. The unevenness in the thickness of the flux on the flat plate is negligible when the balls are great in diameter. However, if the balls are small in diameter, the unevenness in the thickness of the flux produces a problem in that the flux is transcribed onto not only the surfaces of the balls but the surface of the ball arrangement device. If some flux is transcribed on the surface of the ball arrangement device, redundant balls may get adhered on the flux-transcribed portions of the ball arrangement device during the next operation of holding balls, leading to an additional trouble in polluting balls in a tray. On that account, it has been impossible to transcribe flux onto balls below 150 μm in diameter by this method.

Besides, in the above-described method, the transcription of flux onto balls is repeated over the flux applied and spread on a flat plate. As a result, the flux on the flat plate is exposed to the surrounding atmosphere over a long period of time, which gives rise to a problem in that the flux is dried to suffer a change in viscosity.

Moreover, in the above-described method, when spreading flux over the flat plate by using a squeegee or the like, some flux is pushed aside from the squeegee to accumulate on all sides of the flat plate. Here, in order to prevent the ball arrangement device from being polluted with the accumulated flux, the flat plate needs to be provided excessively large in dimension. Therefore, on the occasions of periodical cleaning of machines, the peripheries of a flux transcription unit around the flat plate take a long time to clean up, causing a reduction in the operating time of the unit.

In Japanese patent publication (non-examined) No.10058135, method and equipment for applying flux is disclosed. The method is to apply the flux to a plurality of external pads (electrodes) of semiconductor devices. In that method, a flux applying equipment is provided, having an application plate in which a plurality of application holes are opened. Each application holes is opposite to each said electrodes, and the flux is pressed out of the application holes so as to be applied to the electrodes.

When flux 8 becomes uneven in its amount to be pressed out of the application holes, excessive flux can run out of some application holes while other application holes are not filled with the flux up to the surfaces since they are so small in the amount of flux, possibly resulting in that the flux is not uniformly filled into all the application holes. The occurrence of such situation hampers the stable transcription of the flux onto the respective electrodes. In the cases where the number of electrodes of semiconductor devices is as great as several tens to several thousands to push up the number of electrodes to have flux simultaneously transcribed on, it becomes impossible to fill the flux uniformly into the respective application holes.

SUMMARY OF THE INVENTION

In a method of transcribing flux onto surfaces of balls held by suction on a ball arrangement device, an object of the present invention is to solve the foregoing problems and to provide a ball arrangement method and arrangement apparatus which are capable of transcribing flux even onto fine balls below 150 $\mu$m in diameter, produce no change in properties of the flux, and will not pollute the periphery of a flux transcription device with flux.

More specifically, the gist of the present invention resides in:

(1) A ball arrangement method for simultaneously mounting balls 3 on a mounting object 2 comprising the steps of providing a ball arrangement device 1 having ball suction holes 6, a flux supplying unit composed of a head plate 5 having flux supplying nozzles 7 arranged thereover at positions corresponding to the ball suction holes 6 in the ball arrangement device 1, holding the balls 3 by suction on the ball suction holes 6 in the ball arrangement device 1, transcribing flux or a solder paste onto the balls 3 held by suction in such a manner that the flux or the solder paste is filled into the flux supplying nozzles 7 by supplying the flux or the solder paste from the inside 15 of the head plate 5 of the flux supplying unit, then flux or a solder paste running out of the flux supplying nozzles 7 over the upper surface 14 of the head plate 5 of the flux supplying unit is wiped out, and then the balls 3 held by suction on the ball suction holes 6 in the ball arrangement device 1 are brought into contact with the flux supplying nozzles 7 being filled with the flux or the solder paste, and transferring the balls 3 onto the mounting object 2;

(2) A ball arrangement method for simultaneously mounting balls 3 on a mounting object 2 comprising the steps of providing a ball arrangement device 1 having ball suction holes 6, a flux supplying unit composed of a head plate 5 having flux supplying nozzles 7 arranged thereover at positions corresponding to the ball suction holes 6 in the ball arrangement device 1, holding the balls 3 by suction on the ball suction holes 6 in the ball arrangement device 1, transcribing flux or a solder paste onto the balls 3 held by suction in such a manner that the balls 3 held by suction on the ball suction holes 6 in the ball arrangement device 1 are brought into contact with the flux supplying nozzles 7, and then the flux or the solder paste is filled into the flux supplying nozzles 7 by supplying the flux or the solder paste from the inside 15 of the head plate 5 of the flux supplying unit, and transferring the balls 3 onto the mounting object 2;

(3) The ball arrangement method as set forth in the foregoing (2), wherein, after the flux or the solder paste is transcribed onto the surfaces of the balls 3 and then the balls 3 are separated from the head plate 5, flux or a solder paste running out of the flux supplying nozzles 7 over the upper surface 14 of the head plate 5 is wiped out;

(4) The ball arrangement method as set forth in any one of the foregoing (1) through (3), wherein the flux or the solder paste is filled into the flux supplying nozzles 7 by means of a flux pressurizing unit provided on the back side of the head plate 5;

(5) The ball arrangement method as set forth in the foregoing (1) or (3), wherein the flux or the solder paste running over the upper surface 14 of the head plate 5 is wiped out by means of a squeegee 11;

(6) The ball arrangement method as set forth in the foregoing (1) or (3), wherein the flux or the solder paste running over the upper surface 14 of the head plate 5 is wiped out by means of a tape 12;

(7) The ball arrangement method as set forth in any one of the foregoing (1) through (3), wherein the diameter of the flux supplying nozzle 7 is in the range of ⅓ and 9/10 the diameter of the ball 3;

(8) A ball arrangement apparatus comprising a ball arrangement device 1 having ball suction holes 6 arranged, a mounting base 4 for transferring balls 3 held by suction on the ball suction holes 6 in the ball arrangement device 1 onto a mounting object 2, a flux supplying unit composed of a head plate 5 having flux supplying nozzles 7 arranged thereover at positions corresponding to the ball suction holes 6 in the ball arrangement device 1 and a flux supplying device for supplying flux or a solder paste from the inside 15 of the head plate 5 to fill the flux or the solder paste into the flux supplying nozzles 7, and a flux wiping unit for wiping out flux or a solder paste running out of the flux supplying nozzles 7 over the head plate 5, wherein balls 3 are held by suction on the ball suction holes 6 in the ball arrangement device 1, flux or a solder paste is transcribed onto surfaces of the balls 3 in such a manner that the flux or the solder paste is filled into the flux supplying nozzles 7 by supplying the flux or the solder paste from the inside 15 of the head plate 5 of the flux supplying unit, and then flux or a solder paste running out of the flux supplying nozzles 7 over the upper surface 14 of the head plate 5 of the flux supplying unit is wiped out, and then the balls 3 held by suction on the ball suction holes 6 in the ball arrangement device 1 are brought into contact with the flux supplying nozzles 7 being filled with the flux or the solder paste, and the balls 3 having the flux or the solder paste transcribed are transferred onto the mounting object 2 placed on the mounting base 4;

(9) A ball arrangement apparatus comprising a ball arrangement device 1 having ball suction holes 6 arranged, a mounting base 4 for transferring balls 3 held by suction on the ball suction holes 6 in the ball arrangement device 1 onto a mounting object 2, and a flux supplying unit composed of a head plate 5 having flux supplying nozzles 7 arranged thereover at positions corresponding to the ball suction holes 6 in the ball arrangement device 1 and a flux supplying device for supplying flux or a solder paste from the inside 15 of the head plate 5 to fill the flux or the solder paste into the flux supplying nozzles 7, wherein balls 3 are held by suction on the ball suction holes 6 in the ball arrangement device 1, flux or a solder paste is transcribed onto surfaces of the balls 3 in such a manner that the balls 3 held by suction on the ball suction holes 6 in the ball arrangement device 1 are brought into contact with the flux supplying nozzles 7, and then the flux or the solder paste is filled into the flux supplying nozzles 7 by supplying the flux or the solder paste from the inside 15 of the head plate 5 of the flux supplying unit, and the balls 3 having the flux or the solder paste transcribed are transferred onto the mounting object 2 placed on the mounting base 4;

(10) The ball arrangement apparatus as set forth in the foregoing (8) or (9), wherein the flux supplying device is a flux pressurizing unit provided on the back side of the head plate 5;

(11) The ball arrangement apparatus as set forth in the foregoing (9), further comprising a flux wiping unit for wiping out flux or a solder paste running out of the flux supplying nozzles 7 over the head plate 5;

(12) The ball arrangement apparatus as set forth in the foregoing (8) or (11), wherein the flux wiping unit is a wiping unit employing a squeegee 11;

(13) The ball arrangement apparatus as set forth in the foregoing (8) or (11). wherein the flux wiping unit is a wiping unit employing a tape 12; and

(14) The ball arrangement apparatus as set forth in the foregoing (8) or (9), wherein the diameter of the flux supplying nozzle 7 is in the range of ⅓ and 9/10 the diameter of the ball 3.

The present invention consists in the use of the head plate 5 of the flux supplying unit in transcribing flux or a solder paste onto the balls 3 held by suction on the ball suction holes 6 in the ball arrangement device 1, as shown in FIGS. 1(a) to 1(f). The head plate 5 has the flux supplying nozzles 7 in its surface. The flux supplying nozzles 7 are arranged at the positions corresponding to the ball suction holes 6 in the ball arrangement device 1. As shown in FIG. 1(a), flux 8 is supplied from the inside 15 (the overside from a side to be put into contact with the balls 3) of the head plate 5 to fill the interiors of the flux supplying nozzles 7 with the flux 8 (FIG. 1(b)).

When flux 8 becomes uneven in its amount to be supplied into the respective flux supplying nozzles, excessive flux 8 can run out of some flux supplying nozzles 7 over the surface side while other flux supplying nozzles 7 are not filled with the flux 8 up to the surfaces since they are so small in the amount of supplied flux 8, possibly resulting in that the flux 8 is not uniformly filled into all the flux supplying nozzles. The occurrence of such situation hampers the stable transcription of the flux 8 onto the respective balls 3. In the cases where the number of balls to be arranged on a mounting object 2 is as great as several tens to several thousands to push up the number of balls to have flux simultaneously transcribed on, the uniform filling of the flux 8 into the respective flux supplying nozzles increases its importance, especially.

In the present invention, as set forth in the foregoing (1), the flux 8 be run out of the opening portions of the flux supplying nozzles 7 on the upper surface 14 side of the head plate (FIG. 2(a)) on the occasion of supplying the flux 8 from the inside 15 of the head plate, the flux 8 running over the upper surface 14 of the head plate 5 be wiped out (FIG. 2(b)), and thereafter the balls 3 held on the ball suction holes 6 in the ball arrangement device 1 be brought into contact with the flux supplying nozzles 7 (FIG. 1(c)). Thereby, the respective flux supplying nozzles 7 are uniformed in the amount of the filled flux 8, so that the flux 8 can be stably transcribed onto respective balls 3 even in the cases where the number of the balls 3 to have the flux simultaneously transcribed on is increased to several thousands.

The upper surface 14 of the head plate 5 has no flux 8 transcribed on, except the insides of the flux supplying nozzles 7. Therefore, differing from the conventional technique of spreading and applying flux 8 over the flat plate, the ball arrangement device 1 is free from a fear of being polluted by the unevenly applied flux 8, and the transcription of flux 8 can be stably performed even onto fine balls below 150 $\mu$m in diameter. Besides, the flux 8 is stored in an enclosed chamber to be in contact with ambient atmosphere only at opening portions of the flux supplying nozzles 7; therefore, the flux suffers no change in property even after a long period of time. Moreover, the head plate 5 can be provided to have the same dimension as that of the ball arrangement device 1, which allows the cleaning of the apparatus in a short clean-up time.

In the prior art, the surface of the electrodes is plane, so that the flux pressed out of each application hole must be a shape like a droplet. Otherwise it is impossible to apply the flux to the electrodes.

In the present invention, the flux is supplied to balls and the top of the balls can enter into the flux supplying nozzles. To supply the flux to the balls, the flux is only needed to be filled in the flux supplying nozzles.

Besides, in the present invention, as set forth in the foregoing (2), the balls 3 held on the ball suction holes 6 in the ball arrangement device 1 may be brought into contact with the flux supplying nozzles 7 (FIG. 4(a)) before the flux 8 is supplied from the back of the head plate 5 (FIG. 4(b)). Here, the top opening portions of the flux supplying nozzles 7 are covered with the balls 3 when supplying the flux 8 into the flux supplying nozzles 7, which can prevent excessive flux 8 from running out of the top opening portions over the upper surface side. Therefore, even when flux 8 is supplied into a large number of flux supplying nozzles 7 simultaneously, variations in the amount of the flux supplied into the respective flux supplying nozzles can be suppressed for uniform supply. Here, on the second and succeeding occasions of the flux transcription, only a slight amount of new flux 8 should be supplied into the flux supplying nozzles after the balls 3 are put into contact with the flux supplying nozzles 7 since some of last flux 8 is left inside the flux supplying nozzles.

In the prior art, the surface of the electrodes is plane, so that it is difficult to bring the electrodes into contact with the flux supplying nozzles.

In the present invention, the flux is supplied to balls and it is easy to bring the top of the balls into contact with the flux supplying nozzles.

In the foregoing (2), while the tops of the flux supplying nozzles 7 are covered with the balls 3 to suppress excessive flux 8 so as not to run over the upper surface side, the flux 8 sometimes overruns the upper surface side (FIG. 5(a)) when the flux supplying nozzles 7 is great in number. On that account, the flux 8 running over the upper surface 14 of the head plate 5 may be wiped out (FIG. 2(b)) after the balls 3 having the flux 8 transcribed on are separated from the head plate 5 (FIG. 5(b)), as set forth in the foregoing (4). This prevents the balls 3 and the ball arrangement device 1 from being polluted by flux 8 on the next occasion of putting the balls 3 into contact with the flux supplying nozzles 7. Besides, as compared with the foregoing (2), the flux 8 running over the upper surface is smaller in amount. Accordingly, the amount of flux 8 to be wiped out can be minimized for stable wiping operation.

The present invention does not employ the method of using a mask to print flux onto a mounting object. This avoids problem in that excessive flux gets into the backside of the mask to pollute the surface of the mounting object. Nor employs the present invention the method of transcribing flux adhering and remaining on the extremities of pins onto a mounting object. This accordingly eliminates the problem in deteriorating the stability in the amount of transcribed flux.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIG. 1(a) is a diagram showing the state where flux 8 is being filled into flux supplying nozzles 7, FIG. 1(b) showing the state where the filling of the flux is completed and a ball arrangement device 1 is being lowered, FIG. 1(c) showing the state where balls 3 are put in contact with the head plate 5 of the flux supplying unit, FIG. 1(d) showing the state where the ball arrangement device 1 is being lifted after the flux is transcribed onto the balls 3, FIG. 1(e) showing the state where the balls 3 having the flux transcribed on are put in contact with a mounting object 2, and FIG. 1(f) showing the state where the balls 3 are transferred on the mounting object 2;

FIG. 2(a) is a diagram showing the state where flux is running over the upper surface of the head plate, and FIG. 2(b) showing the state where the overrunning flux is wiped out by the squeegee;

FIG. 3(a) is a diagram showing the case of using a stiffener 16, and FIG. 3(b) showing the case of using a pinch roller 17;

DETAILED DESCRIPTION OF THE PREFERRED EMBODIMENTS

Figure 1:
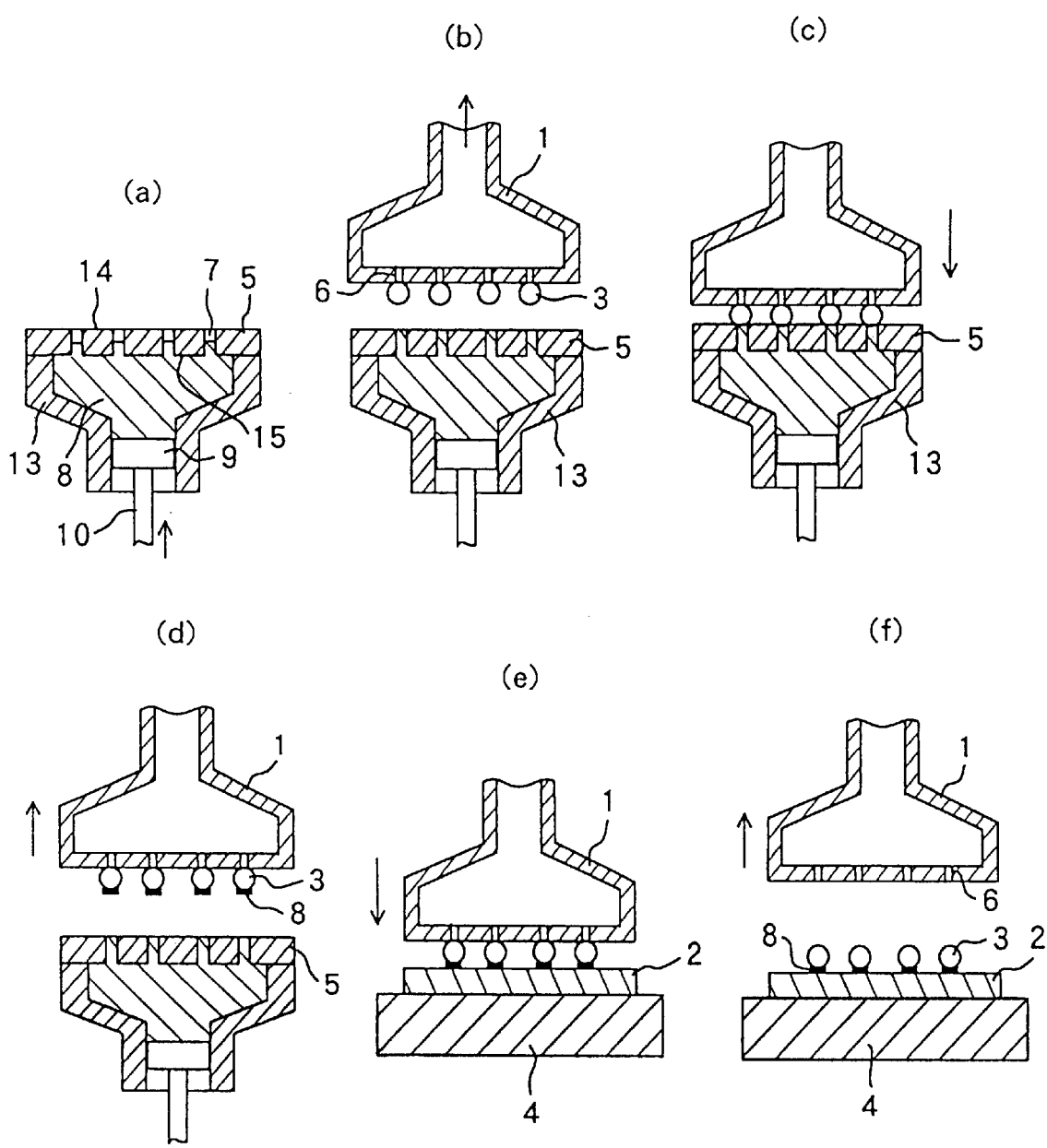
FIGS. 1(a) to 1(f) are conceptual diagrams showing a ball arrangement method and apparatus of the present invention; among these.

In the present invention, balls 3 are mainly solder balls. As solder balls for semiconductor applications to which the present invention is applied, those ranging from 60 to 800 $\mu$m in diameter are mainly used.

A mounting object 2 is a semiconductor chip or a substrate of IC chips. The solder balls are transferred onto the surface of the mounting object 2 at electrode positions where bumps are to be formed. Then, the mounting object 2 is heated so that the solder balls are deposited onto the electrode positions to form the bumps. These bumps make bumps as the junction media between the electrodes of a semiconductor chip and a circuit board, or those in a ball grid array.

Hereinafter, the present invention will be described with reference to FIGS. 1(a) through 5(b).

The transfer of the balls 3 onto the mounting object 2 is carried out through the steps of: holding the balls 3 by suction with ball suction holes 6 in a ball arrangement device 1; transcribing flux or a solder paste onto the balls 3 held by suction; and mounting all the balls 3 simultaneously onto the mounting object 2.

As shown in FIGS. 1(b) to 1(f), the ball arrangement device 1 has the ball suction holes 6 in a plane surface thereof onto which the balls 3 are to be held by suction. The positions where the ball suction holes 6 are formed correspond to the arrangement positions where the balls 3 are to be mounted on the mounting object 2. The ball suction holes 6 are vacuum drafted from the back of the ball arrangement device 1, and thereby the balls 3 are held by suction on the respective ball suction holes 6. The holding of the balls 3 by suction on the ball suction holes 6 can be carried out by, for example, putting a number of balls 3 in a tray and bringing the ball arrangement device 1 from above the tray to approach the balls 3. Here, the holding may also be carried out by using a pre-arrangement plate having trap holes for trapping the balls 3 at positions corresponding to the arrangement positions of the balls 3 on the ball arrangement device 1. In this case, the balls 3 are to be arranged in advance on the pre-arrangement plate by the trap holes, and then held by suction on the ball suction holes 6 in the ball arrangement device 1.

A flux supplying unit of the ball arrangement apparatus is composed of a head plate 5 and a flux supplying device. The head plate 5 of the flux supplying unit has flux supplying nozzles 7 in its surface. The flux supplying nozzles 7 are arranged in accordance with the positions of the ball suction holes 6 in the ball arrangement device 1. Each flux supplying nozzle 7 runs through the head plate 5 to the inside 15 of the nozzles (the other side from the side to be in touch with the balls 3). Flux 8 is pressed from the inside 15 into the flux supplying nozzles 7 by using the flux supplying device, so that the interiors of the flux supplying nozzles 7 are filled with the flux 8. The flux supplying device may be a flux pressurizing unit provided on the back side of the head plate 5. As the flux pressurizing unit, a chamber 13 equipped with a piston pressurizer 10 is attached on the back of the head plate 5, and the chamber 13 is filled with the flux 8 in advance. A piston 9 of the piston pressurizer 10 is moved in a direction of compressing the chamber's capacity to press the flux 8 contained in the chamber into the respective flux supplying nozzles 7 (FIG. 1(a)). Here, as the mechanism for actuating the piston 9 in the piston pressurizer 10, a compressed air drive may be used; however, a servomotor, a pulse motor, or the like is favorably used in order to control small strokes with a high degree of accuracy and excellent repeatability. The head plate 5 and the chamber 13 may be integrally formed.

In a preferable embodiment of the present invention, the pressing of the flux 8 into the flux supplying nozzles 7 is continued until the flux 8 slightly overflows out of opening potions of the flux supplying nozzles 7 at the surface sides, as shown in FIG. 2(a). This can eliminate, among the flux supplying nozzles 7 reaching several tens to several thousands in total number, a flux supplying nozzle 7 suffering a lack in amount of filled flux. For the operation of the piston 9, a servomotor or a pulse motor can be used to control the piston 9 in small strokes with a high degree of accuracy and excellent repeatability. Subsequently, flux 8 running over the upper surface 14 of the head plate 5 is wiped out (FIG. 2(b)). This can realize such a state that all the flux supplying nozzles 7 are filled with the flux 8 up to their top surfaces with no flux running over the upper surface 14 of the head plate 5. This accordingly enables the stable transcription of the flux 8 even in the cases where the balls 3 are extremely great in number.

As shown in FIGS. 2(a) and 2(b), the flux 8 can be wiped out by putting a squeegee 11 into even contact with the upper surface 14 of the head plate 5 and moving the squeegee 11, in other words, by sweeping the upper surface 14 with the squeegee 11. In common use, "squeegee" means a device which is a paddle-shaped part and is capable of sweeping out fluid substances existing on a flat surface for removal. As the material of the squeegee 11, a resin of urethane rubber, or a metal thin plate of stainless steel or the like is well suited. Since the flux 8 to run over the upper surface 14 of the head plate 5 is slight in amount, and the head plate 5 is as nearly small as the mounting object 2 in dimension, the wiping out of the flux 8 by the squeegee 11 can be performed extremely easily.

The wiping out of the flux 8 can also be carried out by using a tape 12 (cleaning tape 12 ), as shown in FIGS. 3(a) and 3(b). The cleaning tape 12 is wound about a stiffener 16 shown in FIG. 3(a) or a pinch roller 17 shown in FIG. 3(b). The wound cleaning tape 12 is brought into contact with the upper surface of the head plate 5, and moved sideways as shown by the arrow 21 to wipe out the flux 8. Here, while the whole wiping device is moved sideways as shown by the arrow 21, a rewinding roll 19 is rotated to take up the cleaning tape 12 fed from feeding roll 18. By this means, flux 8 running over the upper surface of the head plate 5 is caught on the cleaning tape (resulting in the flux 20 ), and taken up around the rewinding roll 19. As the cleaning tape 12, a wiping cloth in common use for manufacturing semiconductors may be used.

Now, the ball arrangement device 1 holding the balls 3 by suction on the ball suction holes 6 is directed so that the balls 3 face the head plate 5 (FIG. 1(b)). Then, with the balls 3 aligned to the corresponding flux supplying nozzles 7, the ball arrangement device 1 is moved toward the head plate 5 to bring the respective balls 3 into contact with the corresponding flux supplying nozzles 7 (FIG. 1(c)). Here, the respective balls 3 are brought to rest so as to be in contact with the upper rims of the flux supplying nozzles 7, so that surfaces of the balls 3 penetrating into the interiors of the flux supplying nozzles 7 are brought into contact with the flux 8. Thereafter, the ball arrangement device 1 is lifted away from the head plate 5, resulting in the balls 3 having the flux 8 transcribed on the surfaces thereof (FIG. 1(d)).

In this state, the balls 3 on the ball arrangement device 1 are located so as to face the mounting object 2, and the balls 3 are moved closer until the balls 3 are in contact with the mounting object 2 (FIG. 1(e)). Subsequently, the vacuum draft at the ball suction holes 6 in the ball arrangement device 1 is stopped, and the ball arrangement device 1 is separated from the mounting object 2, so that the balls 3 are transferred onto the mounting object 2 by means of the adhesion of the flux 8 to complete the simultaneous mounting (FIG. 1(f)).

As the materials of both the ball arrangement device 1 and the head plate 5, metal plates of stainless steel and the like, and conductive resin plates are well suited.

The diameter of the flux supplying nozzles 7 preferably ranges from $1/3$ to $9/10$ the diameter of the balls 3. At diameters below $1/3$, flux can not be sufficiently transcribed onto the balls 3. On the contrary, at diameters exceeding $9/10$, surface tensions acting between the balls 3 and flux 8 within the flux supplying nozzles 7 become so large that the surface tensions possibly overcome the suction forces of the ball arrangement device 1 to fall the balls 3 out of the ball arrangement device 1 in separating the balls 3 from the head plate 5 after the transcription of the flux.

In another preferable embodiment of the present invention, as shown in FIGS. 4(a) and 4(b), the balls 3 held by suction on the ball suction holes 6 in the ball arrangement device 1 may be firstly put into contact with the flux supplying nozzles 7 (FIG. 4(a)), and then the flux 8 may be supplied from the back of the head plate 5 (FIG. 4(b)). In this case, the top opening portions of the respective flux supplying nozzles 7 are covered with the balls 3. Therefore, in pressing the flux 8 from the inside 15 of the head plate 5, once a flux supplying nozzle 7 is filled with the flux 8 up to the corresponding ball 3, a higher pressure is required to further press the flux 8 out of a slight gap at the contacting portion between the flux supplying nozzle 7 and the ball 3 so that the flux 8 runs over the upper surface side. On this account, even in the cases where the flux 8 varies in supplied amount by each flux supplying nozzle, the flux 8 is prevented from being additionally supplied into the flux supplying nozzles in which the flux 8 has already reached the positions of their balls 3, and the overrun of the flux 8 through the filling-completed flux supplying nozzles 7 is avoided while the filling is kept on latish flux supplying nozzles 7. Thereby, the filling of the flux 8 can be uniformly accomplished on all the flux supplying nozzles 7. Here on the completion of the filling, all the balls 3 being in contact with the flux supplying nozzles 7 have the flux 8 transcribed on.

In filling the flux 8 into a number of flux supplying nozzles 7 simultaneously, even though the openings of the flux supplying nozzles and the balls 3 are in contact with each other, the respective contacting portions provide different resistances to flux 8 to be pushed out therethrough. This makes it impossible to completely suppress the overflow of the flux 8 through flux supplying nozzles 7 having smaller resistances (FIG. 5(a)). Accordingly, after the transcription of flux 8 onto the balls 3 is completed and the balls 3 are separated from the head plate 5 (FIG. 5(b)), the flux 8 running over the head plate 5 is favorably wiped out (FIG. 2(b)) before another set of balls 3 is brought into contact with the head plate 5 for the transcription of flux 8 in the next timing. The wiping out of the flux 8 can be carried out by employing the same method by the squeegee 11 or the tape 12 as described above. In the present embodiment, the flux 8 to run over the upper surface is small in amount. Therefore, the amount of flux 8 to be wiped out can be minimized for stable wiping operation.

When the piston 9 of a flux pressurizing unit has been compressed to its compression limit, the chamber 13 needs to be filled with flux 8 again. In the present invention, the chamber 13, including the flux pressurizing unit if required. is provided as a cartridge, so that the vacant chamber 13 and the like having the flux used up can be removed from the head plate 5 and then a new chamber 13 and the like being full of flux can be mounted thereon. This can reduce a time required for the replacement of flux as well as avoid a trouble in that the periphery of the apparatus is polluted by flux during the replacement of flux.

Aiming to mount solder balls on a substrate of IC chips in order to form solder bumps on the substrate, the ball arrangement methods of the present invention were embodied. The diameters of the solder balls were of the three types of No. 1 to 3 shown in Table 1. The number of solder balls to be mounted was 336 for each type. Flux was transcribed on the solder balls.

TABLE 1

| No. | DIAMETER OF SOLDER BALL ($\mu$m) | NUMBER OF SOLDER BALLS | DIAMETER OF FLUX SUPPLYING NOZZLE ($\mu$m) | WIPING DEVICE | TIMING OF WIPING OUT |
|---|---|---|---|---|---|
| 1 | 760 | 336 | 250 | TAPE | BEFORE CONTACT OF SOLDER BALLS |
| 2 | 150 | 336 | 135 | SQUEEGEE OF STAINLESS STEEL THIN PLATE | |
| 3 | 400 | 336 | 200 | TAPE | AFTER CONTACT |

As the head plate 5 of the flux supplying unit and the ball arrangement device 1 were employed those having the shapes shown in FIGS. 1(*a*) through 1(*f*). As the material of the head plate 5, stainless steel was employed. As the material of the ball arrangement device 1, a conductive resin was employed. The diameter of the flux supplying nozzle 7 in No. 1 was 250 $\mu$m (⅓ the diameter of the solder ball), that in No. 2 was 135 $\mu$m (%10 the diameter of the solder ball), and that in No. 3 was 200 $\mu$m (½ the diameter of the solder ball).

Figure 2:
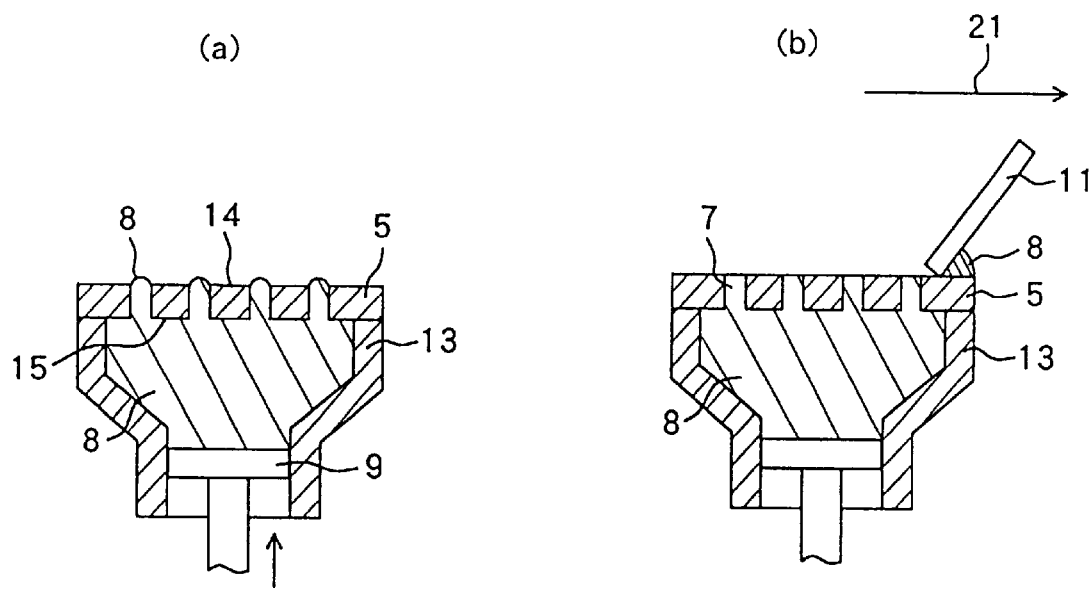
FIGS. 2(a) and 2(b) are conceptual diagrams showing a state where flux running over the upper surface of the head plate 5 of the flux supplying unit is wiped out by a squeegee 11; of these.
Figure 3:
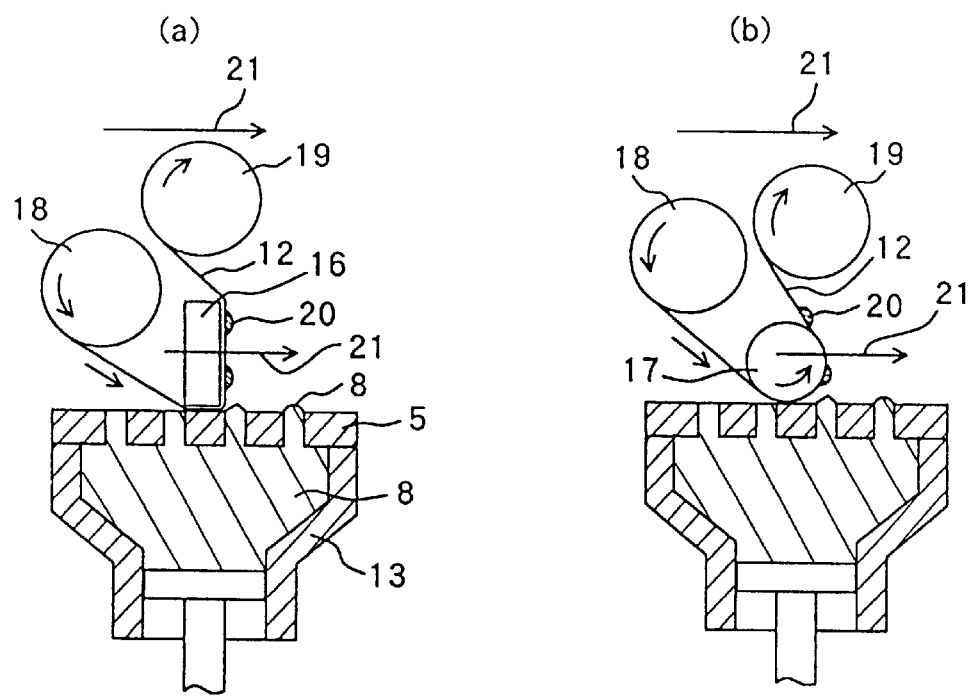
FIGS. 3(a) and 3(b) are conceptual diagrams showing a state where flux running over the upper surface of the head plate 5 of the flux supplying unit is wiped out by a tape 12; of these.

As the wiping devices of Nos. 1 and 3 the cleaning tape system shown in FIG. 3(*a*) was employed, in which a wiping cloth for use in manufacturing semiconductors was used as the cleaning tape. As the wiping device of No. 2 the squeegee shown in FIG. 2 was employed. As the squeegee, a thin plate of stainless steel was used.

As shown in FIG. 1(*a*), flux was stuffed in a space enclosed by the head plate 5 and the chamber 13, and the pwaston 9 was moved to fill the flux into the flux supplying nozzles 7. In the embodiments Nos. 1 and 2, the filling was continued until the flux overflowed from the top opening portions of all the flux supplying nozzles 7, as shown in FIG. 2(*a*). In No. 2, the squeegee 11 was then swept in the direction of the arrow 21 as shown in FIG. 2(*b*) to wipe out the flux 8 running over the upper surface of the head plate 5. In No. 1, while taking up the cleaning tape 12 by the rewinding roll 19, the whole wiping device was moved to traverse the head plate 5. Here, the cleaning tape 12 was pressed against the head plate 5 by the stiffener 16, so that the flux running over the head plate 5 was caught on the tape's surface (the flux 20).

As shown in FIG. 1(*b*), on the ball suction holes 6 in the ball arrangement device 1 the solder balls 3 were held by suction in advance. Then, as shown in FIG. 1(*c*), with the upper surface of the head plate 5 directed upward and a surface of the ball arrangement device 1 holding the solder balls 3 downward, the respective solder balls 3 held by suction were brought into contact with the corresponding flux supplying nozzles 7. At this point, the flux 8 was transcribed onto each of the extremities of the solder balls 3.

Then, as shown in FIG. 1(*d*), the ball arrangement device 1 was separated from the head plate 5 to obtain the solder balls 3 having the flux 8 transcribed on their extremities thereof.

Figure 4:
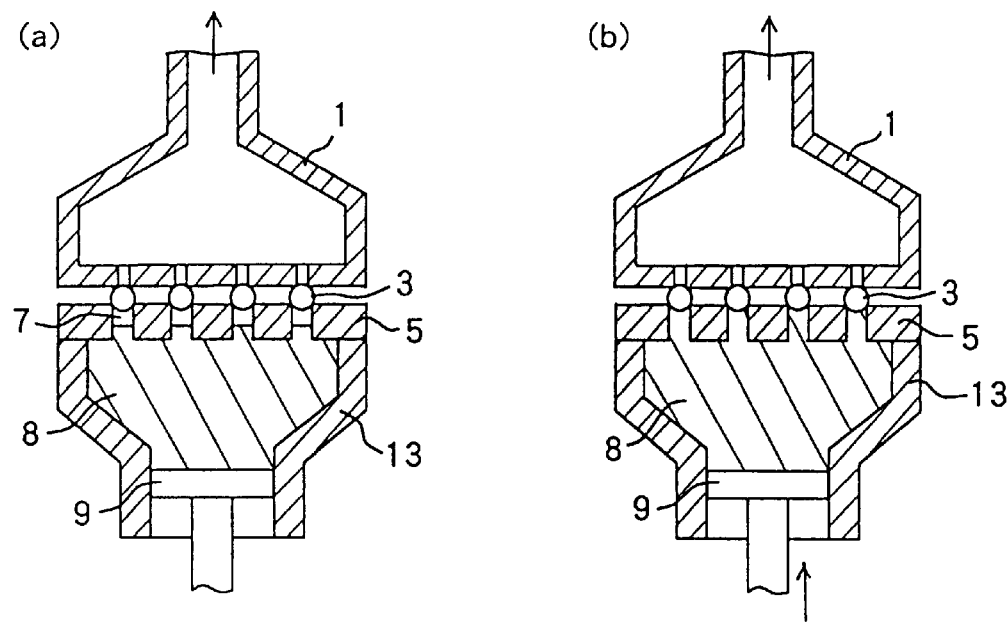
FIGS. 4(a) and 4(b) are conceptual diagrams showing a state where the balls 3 are brought into contact with the head plate 5 of the flux supplying unit before the flux 8 is filled into the flux supplying nozzles 7.
Figure 5:
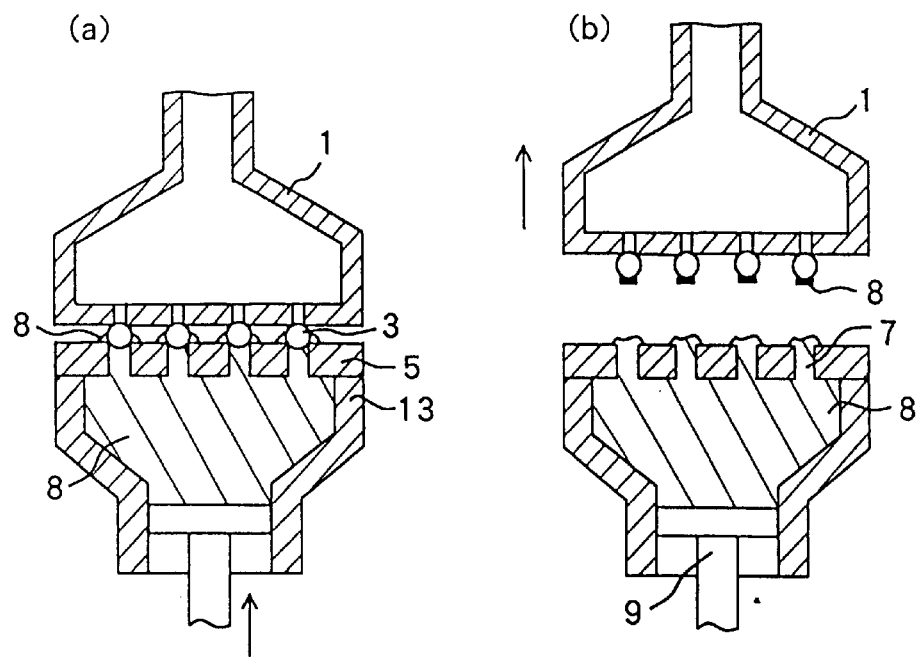
FIGS. 5(a) and 5(b) are conceptual diagrams showing a state where the flux 8 is filled into the flux supplying nozzles 7 after the balls 3 are put in contact with the head plate 5 of the flux supplying unit, and the succeeding state where some flux is running over the head plate.

In the embodiment No. 3, the solder balls 3 were put into contact with the flux supplying nozzles 7 as shown in FIG. 4(*a*) before the filling of the flux 8 was started. The filling was continued until the flux 8 run over the upper surface of the head plate 5 as shown in FIG. 5(*a*). Subsequently, the ball arrangement device 1 was separated from the head plate 5 as shown in FIG. 5(*b*). Then, the flux 8 running over the upper surface of the head plate 5 was wiped out by the method shown in FIG. 3(*a*), as in the embodiment No. 1.

A substrate of IC chips was used as the mounting object 2. The substrate of IC chips was placed on a mounting base 4. The ball arrangement device 1 was pressed against the substrate 2 as shown in FIG. 1(*e*), so that the solder balls 3 held thereon were pressed against prescribed electrodes on the substrate 2. Thereafter, the draft at the ball suction holes 6 in the ball arrangement device 1 was stopped, and the ball arrangement device was separated from the substrate 2 as shown in FIG. 1(*f*) to transfer the solder balls 3 onto the substrate 2 by means of the adhesion of the flux 8.

In each of the embodiments Nos. 1 to 3, the ball arrangement processes were successively applied to a hundred of substrates 2. As a result, in each embodiment, all solder balls were stably transferred onto the substrate without any miss-mounting. Besides, a trouble in that the surface of the ball arrangement device 1 was polluted by the flux 8 was not generated at all. Moreover, since the flux 8 was not exposed to air, the flux 8 did not suffer a deterioration in its material even after a long period of time.

In the embodiment No. 3, the consumption amount of the flux 8 was reduced to ⅒ as compared with the embodiments Nos. 1 and 2. Note that the calculation was given with the respective diameters of the solder balls converted into an identical value.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A ball arrangement method for simultaneously mounting balls on a mounting object comprising the steps of
providing a ball arrangement device having ball suction holes, a flux supplying unit composed of a head plate having flux supplying nozzles arranged thereover at positions corresponding to said ball suction holes in said ball arrangement device, holding said balls by suction on said ball suction holes in said ball arrangement device, transcribing flux or a solder paste onto said balls held by suction in such a manner that the flux or the solder paste is filled into said flux supplying nozzles by supplying the flux or the solder paste from the inside of said head plate of said flux supplying unit, then flux or a solder paste running out of said flux supplying nozzles over an upper surface of said head plate is wiped out, and then said balls held by suction on said ball suction holes in said ball arrangement device are brought into contact with said flux supplying nozzles being filled with said flux or said solder paste, and transferring said balls onto said mounting object.

2. The ball arrangement method according to claim 1, wherein said flux or said solder paste is filled into said flux supplying nozzles by means of a flux pressurizing unit provided on the back side of said head plate.

3. The ball arrangement method according to claim 1, wherein the flux or the solder paste running over the upper surface of said head plate is wiped out by means of a squeegee.

4. The ball arrangement method according to claim 1, wherein the flux or the solder paste running over the upper surface of said head plate is wiped out by means of a tape.

5. The ball arrangement method according to claim 1, wherein the diameter of said flux supplying nozzle is in the range of ⅓ and 9/10 the diameter of said ball.

6. A ball arrangement method for simultaneously mounting balls on a mounting object comprising the steps of providing a ball arrangement device having ball suction holes, a flux supplying unit composed of a head plate having flux supplying nozzles arranged thereover at positions corresponding to said ball suction holes in said ball arrangement device, holding said balls by suction on said ball suction holes in said ball arrangement device, transcribing flux or a solder paste onto said balls held by suction in such a manner that said balls held by suction on said ball suction holes in said ball arrangement device are brought into contact with said flux supplying nozzles, and then said flux or said solder paste is filled into said flux supplying nozzles by supplying said flux or said solder paste from the inside of said head plate of said flux supplying unit, and transferring said balls onto said mounting object.

7. The ball arrangement method according to claim 6, wherein said flux or said solder paste is filled into said flux supplying nozzles by means of a flux pressurizing unit provided on the back side of said head plate.

8. The ball arrangement method according to claim 6, wherein the flux or the solder paste running over the upper surface of said head plate is wiped out by means of a squeegee.

9. The ball arrangement method according to claim 6, wherein the flux or the solder paste running over the upper surface of said head plate is wiped out by means of a tape.

10. The ball arrangement method according to claim 6, wherein the diameter of said flux supplying nozzle is in the range of ⅓ and 9/10 the diameter of said ball.

11. The ball arrangement method according to claim 6, wherein, after said flux or said solder paste is transcribed onto the surfaces of said balls and then said balls are separated from said head plate, flux or a solder paste running out of said flux supplying nozzles over the surface of said head plate is wiped out.

12. The ball arrangement method according to claim 11, wherein said flux or said solder paste is filled into said flux supplying nozzles by means of a flux pressurizing unit provided on the back side of said head plate.

13. The ball arrangement method according to claim 11, wherein the flux or the solder paste running over the upper surface of said head plate is wiped out by means of a squeegee.

14. The ball arrangement method according to claim 11, wherein the flux or the solder paste running over the upper surface of said bead plate is wiped out by means of a tape.

15. The ball arrangement method according to claim 11, wherein the diameter of said flux supplying nozzle is in the range of ⅓ and 9/10 the diameter of said ball.

* * * * *

UNITED STATES PATENT AND TRADEMARK OFFICE
CERTIFICATE OF CORRECTION

PATENT NO.    : 6,302,316 B1
DATED         : October 16, 2001
INVENTOR(S)   : Nobuaki Hayashi et al.

It is certified that error appears in the above-identified patent and that said Letters Patent is hereby corrected as shown below:

<u>Title page,</u>
Item [57], please replace the ABSTRACT with the following:
-- ABSTRACT,
      A ball arrangement method of simultaneously mounting balls on a mounting object includes holding the balls by suction on ball suction holes in a ball arrangement device having the ball suction holes arranged therein, transcribing flux or a solder paste onto the balls held by suction, and transferring the balls onto the mounting object. A flux supplying unit includes a head plate 5 at an end thereof, and flux supplying nozzles 7 are arranged over the head plate 5 at positions corresponding to the ball suction holes 6 in the ball arrangement device 1. The flux or the solder paste is transcribed onto surfaces of the balls by filling the flux or the solder paste into the flux supplying nozzles 7 by supplying the flux or the solder paste from the back of the head plate 5, and then bringing the balls held by suction into contact with the flux supplying nozzles filled with the flux or the solder paste.

<u>Column 3,</u>
Lines 8-16, please replace the paragraph with the following rewritten paragraph:
--       In Japanese patent publication (non-examined) No. 10058135, a method and equipment for applying flux is disclosed. The method is to apply the flux to a plurality of external pads (electrodes) of semiconductor devices. In that method, flux applying equipment is provided, having an application plate in which a plurality of application holes are opened. Each application hole is opposite to one of the electrodes, and the flux is pressed out of the application holes so as to be applied to the electrodes. --
Lines 17-29, please replace the paragraph with the following rewritten paragraph:
--       When flux becomes uneven in its amount to be pressed out of the application holes, excessive flux can run out of some application holes while other application holes are not filled with the flux up to the surfaces since they have very little flux, possibly resulting in that the flux is not uniformly filled into all the application holes. The occurrence of such situation hampers the stable transcription of the flux onto the respective electrodes. In the cases where the number of electrodes of semiconductor devices is as great as several tens to several thousands thereby increasing the number of electrodes requiring that flux be simultaneously transcribed on, it becomes impossible to fill the flux uniformly into the respective application holes. --

UNITED STATES PATENT AND TRADEMARK OFFICE
CERTIFICATE OF CORRECTION

PATENT NO.     : 6,302,316 B1
DATED          : October 16, 2001
INVENTOR(S)    : Nobuaki Hayashi et al.

It is certified that error appears in the above-identified patent and that said Letters Patent is hereby corrected as shown below:

<u>Column 3, line 31 through column 7, line 22,</u>
Please replace SUMMARY OF THE INVENTION with the following substitute:
-- SUMMARY OF THE INVENTION
    In a method of transcribing flux onto surfaces of balls held by suction on a ball arrangement device, an object of the present invention is to solve the foregoing problems and to provide a ball arrangement method and arrangement apparatus which are capable of transcribing flux even onto fine balls below 150 $\mu$m in diameter, produce no change in properties of the flux, and will not pollute the periphery of a flux transcription device with flux.
    More specifically, the present invention includes a ball arrangement method for simultaneously mounting balls 3 on a mounting object 2. The method includes providing a ball arrangement device 1 having ball suction holes 6, and providing a flux supplying unit composed of a head plate 5 having flux supplying nozzles 7 arranged thereover at positions corresponding to the ball suction holes 6 in the ball arrangement device 1. The balls 3 are held by suction on the ball suction holes 6 in the ball arrangement device 1. Flux or a solder paste is transcribed onto the balls 3 held by suction in such a manner that the flux or the solder paste is filled into the flux supplying nozzles 7 by supplying the flux or the solder paste from the inside 15 of the head plate 5 of the flux supplying unit.
Then flux or a solder paste running out of the flux supplying nozzles 7 over the upper surface 14 of the head plate 5 of the flux supplying unit is wiped out, and then the balls 3 held by suction on the ball suction holes 6 in the ball arrangement device 1 are brought into contact with the flux supplying nozzles 7 being filled with the flux or the solder paste. The balls 3 are then transferred onto the mounting object 2.
    A ball arrangement method for simultaneously mounting balls 3 on a mounting object 2 includes providing a ball arrangement device 1 having ball suction holes 6, and providing a flux supplying unit composed of a head plate 5 having flux supplying nozzles 7 arranged thereover at positions corresponding to the ball suction holes 6 in the ball arrangement device 1. The balls 3 are held by suction on the ball suction holes 6 in the ball arrangement device 1. Flux or a solder paste is transcribed onto the balls 3 held by suction in such a manner that the balls 3 held by suction on the ball suction holes 6 in the ball arrangement device 1 are brought into contact with the flux supplying nozzles 7. Then the flux or the solder paste is filled into the flux supplying nozzles 7 by supplying the flux or the solder paste from the inside 15 of the head plate 5 of the flux supplying unit. The balls 3 are then transferred onto the mounting object 2.

UNITED STATES PATENT AND TRADEMARK OFFICE
CERTIFICATE OF CORRECTION

PATENT NO.    : 6,302,316 B1
DATED         : October 16, 2001
INVENTOR(S)   : Nobuaki Hayashi et al.

It is certified that error appears in the above-identified patent and that said Letters Patent is hereby corrected as shown below:

SUMMARY OF THE INVENTION SECTION cont'd,

The ball arrangement method as set forth in the foregoing can also include, after the flux or the solder paste is transcribed onto the surfaces of the balls 3 and then the balls 3 are separated from the head plate 5, wiping out flux or solder paste running out of the flux supplying nozzles 7 over the upper surface 14 of the head plate 5.

The ball arrangement method as set forth above can also include filling the flux or the solder paste into the flux supplying nozzles 7 by means of a flux pressurizing unit provided on the backside of the head plate 5.

The ball arrangement method as set forth in the foregoing can also include wiping out the flux or the solder paste running over the upper surface 14 of the head plate 5 by means of a squeegee 11.

The ball arrangement method as set forth in the foregoing can also include wiping out the flux or the solder paste running over the upper surface 14 of the head plate 5 by means of a tape 12.

The ball arrangement method as set forth above can also include setting the diameter of the flux supplying nozzle 7 in the range of 1/3 and 9/10 the diameter of the ball 3.

A ball arrangement apparatus comprising a ball arrangement device 1 has ball suction holes 6, a mounting base 4 for transferring balls 3 held by suction on the ball suction holes 6 in the ball arrangement device 1 onto a mounting object 2, a flux supplying unit composed of a head plate 5 having flux supplying nozzles 7 arranged thereover at positions corresponding to the ball suction holes 6 in the ball arrangement device 1, and a flux supplying device for supplying flux or a solder paste from the inside 15 of the head plate 5 to fill the flux or the solder paste into the flux supplying nozzles 7. A flux wiping unit wipes out flux or a solder paste running out of the flux supplying nozzles 7 over the head plate 5. Balls 3 are held by suction on the ball suction holes 6 in the ball arrangement device 1. Flux or solder paste is transcribed onto surfaces of the balls 3 in such a manner that the flux or the solder paste is filled into the flux supplying nozzles 7 by supplying the flux or the solder paste from the inside 15 of the head plate 5 of the flux supplying unit, and then flux or a solder paste running out of the flux supplying nozzles 7 over the upper surface 14 of the head plate 5 of the flux supplying unit is wiped out. Then the balls 3 held by suction on the ball suction holes 6 in the ball arrangement device 1 are brought into contact with the flux supplying nozzles 7 being filled with the flux or the solder paste, and the balls 3 having the flux or the solder paste transcribed are transferred onto the mounting object 2 placed on the mounting base 4.

A ball arrangement comprising a ball arrangement device 1 having ball suction holes 6, a mounting base 4 for transferring balls 3 held by suction on the ball suction holes 6 in the ball arrangement device 1 onto a mounting object 2, and a flux supplying unit composed of a head plate 5 having flux supplying nozzles 7 arranged thereover at positions corresponding to the ball suction holes 6 in the ball arrangement device 1. A flux supplying device supplies flux or solder paste from the inside 15 of the head plate

UNITED STATES PATENT AND TRADEMARK OFFICE
CERTIFICATE OF CORRECTION

PATENT NO.    : 6,302,316 B1
DATED         : October 16, 2001
INVENTOR(S)   : Nobuaki Hayashi et al.

It is certified that error appears in the above-identified patent and that said Letters Patent is hereby corrected as shown below:

SUMMARY OF THE INVENTION SECTION cont'd,
5 to fill the flux or the solder paste into the flux supplying nozzles 7. Balls 3 are held by suction on the ball suction holes 6 in the ball arrangement device 1, and flux or solder paste is transcribed onto surfaces of the balls 3 in such a manner that the balls 3 held by suction on the ball suction holes 6 in the ball arrangement device 1 are brought into contact with the flux supplying nozzles 7. Then the flux or the solder paste is filled into the flux supplying nozzles 7 by supplying the flux or the solder paste from the inside 15 of the head plate 5 of the flux supplying unit, and the balls 3 having the flux or the solder paste transcribed are transferred onto the mounting object 2 placed on the mounting base 4.

The ball arrangement apparatus as set forth in the foregoing can be designed such that the flux supplying device is a flux pressurizing unit provided on the back side of the head plate 5.

The ball arrangement apparatus as set forth in the foregoing can further comprise a flux wiping unit for wiping out flux or solder paste running out of the flux supplying nozzles 7 over the head plate 5.

The ball arrangement apparatus as set forth in the foregoing can be designed so that the flux wiping unit is a wiping unit employing a squeegee 11.

The ball arrangement apparatus as set forth in the foregoing can be designed so that the flux wiping unit is a wiping unit employing a tape 12.

The ball arrangement apparatus as set forth in the foregoing can be designed so that the diameter of the flux supplying nozzle 7 is in the range of 1/3 and 9/10 the diameter of the ball 3.

The present invention comprises the use of the head plate 5 of the flux supplying unit in transcribing flux or a solder paste onto the balls 3 held by suction on the ball suction holes 6 in the ball arrangement device 1, as shown in Figs. 1(a) to 1(f). The head plate 5 has the flux supplying nozzles 7 in its surface. The flux supplying nozzles 7 are arranged at the positions corresponding to the ball suction holes 6 in the ball arrangement device 1. As shown in Fig. 1(a), flux 8 is supplied from the inside 15 (the side opposite the side which is to contact the balls 3) of the head plate 5 to fill the interiors of the flux supplying nozzles 7 with the flux 8 (Fig. 1(b)).

When flux 8 becomes uneven as it is supplied into the respective flux supplying nozzles, excessive flux 8 can run out of some flux supplying nozzles 7 over the surface side while other flux supplying nozzles 7 are not filled with the flux 8 up to the surfaces since they are so small in the amount of supplied flux 8, possibly resulting in the flux 8 not being uniformly filled into all the flux supplying nozzles. The occurrence of such situation hampers the stable transcription of the flux 8 onto the respective balls 3. In the cases where the number of balls to be arranged on a mounting object 2 is as great as several tens to several thousands thereby increasing the number of balls required to have flux simultaneously transcribed on, the uniform filling of the flux 8 into the respective flux supplying nozzles particularly increases its importance, especially.

UNITED STATES PATENT AND TRADEMARK OFFICE
CERTIFICATE OF CORRECTION

PATENT NO.    : 6,302,316 B1
DATED         : October 16, 2001
INVENTOR(S)   : Nobuaki Hayashi et al.

It is certified that error appears in the above-identified patent and that said Letters Patent is hereby corrected as shown below:

SUMMARY OF THE INVENTION SECTION cont'd,
In the present invention, as set forth in the foregoing, the flux 8 is run out of the opening portions of the flux supplying nozzles 7 on the upper surface 14 of the head plate (Fig. 2(a)) when the flux 8 is supplied from the inside 15 of the head plate, and the flux 8 running over the upper surface 14 of the head plate 5 be wiped out (Fig. 2(b)). Thereafter, the balls 3 held on the ball suction holes 6 in the ball arrangement device 1 are brought into contact with the flux supplying nozzles 7 (Fig. 1(c)). Thereby, the respective flux supplying nozzles 7 are made uniform in the amount of the filled flux 8, so that the flux 8 can be stably transcribed onto respective balls 3 even in the cases where the number of balls 3 to have the flux simultaneously transcribed thereon is increased to several thousands.

The upper surface 14 of the head plate 5 has no flux 8 transcribed thereon, except the insides of the flux supplying nozzles 7. Therefore, differing from the conventional technique of spreading and applying flux 8 over the flat plate, the ball arrangement device 1 is free from a risk of being polluted by the unevenly applied flux 8, and the transcription of flux 8 can be stably performed even onto fine balls below 150 $\mu$m in diameter. Besides, the flux 8 is stored in an enclosed chamber to be in contact with ambient atmosphere only at opening portions of the flux supplying nozzles 7. Therefore, the flux suffers no change in property even after a long period of time. Moreover, the head plate 5 can be provided to have the same dimension as that of the ball arrangement device 1, which allows the cleaning of the apparatus in a short clean-up time.

In the prior art, the surface of the electrodes is planar, so that the flux pressed out of each application hole must be shaped like a droplet. Otherwise it is impossible to apply the flux to the electrodes.

In the present invention, the flux is supplied to balls and the top of the balls can enter into the flux supplying nozzles. To supply the flux to the balls, the flux is only needed to be filled in the flux supplying nozzles.
Besides, in the present invention, as set forth in the foregoing, the balls 3 held on the ball suction holes 6 in the ball arrangement device 1 may be brought into contact with the flux supplying nozzles 7 (Fig. 4(a)) before the flux 8 is supplied from the back of the head plate 5 (Fig. 4(b)). Here, the top opening portions of the flux supplying nozzles 7 are covered with the balls 3 when supplying the flux 8 into the flux supplying nozzles 7, which can prevent excessive flux 8 from running out of the top opening portions over the upper surface side. Therefore, even when flux 8 is supplied into a large number of flux supplying nozzles 7 simultaneously, variations in the amount of the flux supplied into the respective flux supplying nozzles can be suppressed for uniform supply. Here, on the second and succeeding occasions of the flux transcription, only a slight amount of new flux 8 should be supplied into the flux supplying nozzles after the balls 3 are put into contact with the flux supplying nozzles 7 since some of last flux 8 is left inside the flux supplying nozzles.

UNITED STATES PATENT AND TRADEMARK OFFICE
CERTIFICATE OF CORRECTION

PATENT NO. : 6,302,316 B1
DATED : October 16, 2001
INVENTOR(S) : Nobuaki Hayashi et al.

It is certified that error appears in the above-identified patent and that said Letters Patent is hereby corrected as shown below:

SUMMARY OF THE INVENTION SECTION cont'd
    In the prior art, the surface of the electrodes is planar, so that it is difficult to bring the electrodes into contact with the flux supplying nozzles.
    In the present invention, the flux is, supplied to balls and it is easy to bring the top of the balls into contact with the flux supplying nozzles.
    In the foregoing, while the tops of the flux supplying nozzles 7 are covered with the balls 3 to suppress excessive flux 8 so as not to run over the upper surface side, the flux 8 sometimes overruns the upper surface side (Fig. 5(a)) when there are a large number of flux supplying nozzles 7. On that account, the flux 8 running over the upper surface 14 of the head plate 5 may be wiped out (Fig. 2(b)) after the balls 3 having the flux 8 transcribed thereon are separated from the head plate 5 (Fig. 5(b)), as set forth in the foregoing. This prevents the balls 3 and the ball arrangement device 1 from being polluted by flux 8 on the next occasion of putting the balls 3 into contact with the flux supplying nozzles 7. Besides, as compared with the foregoing, the flux 8 running over the upper surface is smaller in amount. Accordingly, the amount of flux 8 to be wiped out can be minimized for stable wiping operation.
    The present invention does not employ the method of using a mask to print flux onto a mounting object. This avoids the problem in which excessive flux gets into the backside of the mask to pollute the surface of the mounting object. The present invention also does not employ the method of transcribing flux adhering and remaining on the extremities of pins onto a mounting object. This accordingly eliminates the problem in decreasing stability in the amount of transcribed flux.
    The nature, principle and utility of the invention will become more apparent from the following detailed description when read in conjunction with the accompanying drawings in which like parts are designated by like reference numerals or characters.

<u>Column 8, line 66 through column 9, line 16,</u>
Please replace the paragraph with the following rewritten paragraph:
    In a preferable embodiment of the present invention, the pressing of the flux 8 into the flux supplying nozzles 7 is continued until the flux 8 slightly overflows out of opening potions of the flux supplying nozzles 7 at the surface sides, as shown in Fig. 2 (a). This can eliminate, among the flux supplying nozzles 7 reaching several tens to several thousands in total number, a flux supplying nozzle 7 having an insufficient amount of filled flux. For the operation of the piston 9, a servomotor or a pulse motor can be used to control the piston 9 in small strokes with a high degree of accuracy and excellent repeatability. Subsequently, flux 8 running over the upper surface 14 of the head plate 5 is wiped out (Fig. 2(b)). This can realize such a state that all the flux supplying nozzles 7 are filled with the flux 8 up to their top surfaces with no flux running over the upper surface 14 of the head plate 5. This accordingly enables the stable transcription of the flux 8 even in the cases where the balls 3 are extremely great in number.

UNITED STATES PATENT AND TRADEMARK OFFICE
CERTIFICATE OF CORRECTION

PATENT NO. : 6,302,316 B1
DATED : October 16, 2001
INVENTOR(S) : Nobuaki Hayashi et al.

It is certified that error appears in the above-identified patent and that said Letters Patent is hereby corrected as shown below:

SUMMARY OF THE INVENTION SECTION cont'd
Column 10,
Lines 6-15, please replace the paragraph spanning lines 6-15 with the following rewritten paragraph:
 The diameter of the flux supplying nozzles 7 preferably ranges from 1/3 to 9/10 the diameter of the balls 3. At diameters below 1/3, flux can not be sufficiently transcribed onto the balls 3. On the contrary, at diameters exceeding 9/10, surface tensions acting between the balls 3 and flux 8 within the flux supplying nozzles 7 become so large that the surface tensions possibly overcome the suction forces of the ball arrangement device 1 so that the balls 3 may fall out of the ball arrangement device 1 in separating the balls 3 from the head plate 5 after the transcription of the flux.

Column 11,
Lines 44-58, please replace the paragraph with the following rewritten paragraph:
 As shown in Fig. 1(a), flux was stuffed in a space enclosed by the head plate 5 and the chamber 13, and the piston 9 was moved to fill the flux into the flux supplying nozzles 7. In the embodiments Nos. 1 and 2, the filling was continued until the flux overflowed from the top opening portions of all the flux supplying nozzles 7, as shown in Fig. 2(a). In No. 2, the squeegee 11 was then swept in the direction of the arrow 21 as shown in Fig. 2(b) to wipe out the flux 8 running over the upper surface of the head plate 5. In No. 1, while taking up the cleaning tape 12 by the rewinding roll 19, the whole wiping device was moved to traverse the head plate 5. Here, the cleaning tape 12 was pressed against the head plate 5 by the stiffener 16, so that the flux running over the head plate 5 was caught on the tape's surface (the flux 20).

Column 12,
Lines 39-47, please replace the paragraph with the following rewritten paragraph:
 In each of the embodiments Nos. 1 to 3, the ball arrangement processes were successively applied to a hundred substrates 2. As a result, in each embodiment, all solder balls were stably transferred onto the substrate without any miss-mounting. Besides, a problem in that the surface of the ball arrangement device 1 was polluted by the flux 8 was not generated at all. Moreover, since the flux 8 was not exposed to air, the flux 8 did not suffer a deterioration in its material even after a long period of time.

UNITED STATES PATENT AND TRADEMARK OFFICE
CERTIFICATE OF CORRECTION

| | |
|---|---|
| PATENT NO. | : 6,302,316 B1 |
| DATED | : October 16, 2001 |
| INVENTOR(S) | : Nobuaki Hayashi et al. |

It is certified that error appears in the above-identified patent and that said Letters Patent is hereby corrected as shown below:

<u>Column 12, line 61 through Column 13, line 14,</u>
Please replace claim 1 with the following claim 1:
    1.    A ball arrangement method for simultaneously mounting balls on a mounting object comprising:
    providing a ball arrangement device having ball suction holes, a flux supplying unit composed of a head plate having flux supplying nozzles arranged thereover at positions corresponding to said ball suction holes in said ball arrangement device;
    holding said balls by suction on said ball suction holes in said ball arrangement device;
    transcribing flux or a solder paste onto said balls held by suction by filling the flux or the solder paste into said flux supplying nozzles by supplying the flux or the solder paste from the inside of said head plate of said flux supplying unit, then wiping out flux or a solder paste running out of said flux supplying nozzles over an upper surface of said head plate, and then bringing said balls held by suction on said ball suction holes in said ball arrangement device into contact with said flux supplying nozzles filled with said flux or said solder paste; and
    transferring said balls onto said mounting object.

<u>Column 13,</u>
Lines 15-18, please replace claim 2 with the following claim 2:
    2.    The ball arrangement method according to claim 1, wherein said flux or said solder paste is filled into said flux supplying nozzles by a flux pressurizing unit provided on the back side of said head plate.
Lines 19-22, please replace claim 3 with the following claim 3:
    3.    The ball arrangement method according to claim 1, wherein the flux or the solder paste running over the upper surface of said head plate is wiped out by a squeegee.
Lines 23-25, please replace claim 4 with the following claim 4:
    4.    The ball arrangement method according to claim 1, wherein the flux or the solder paste running over the upper surface of said head plate is wiped out by a tape.
Lines 26-28, please replace claim 5 with the following claim 5:
    The ball arrangement method according to claim 1, wherein the diameter of each of said flux supplying nozzles is in the range of 1/3 to 9/10 the diameter of said ball.

UNITED STATES PATENT AND TRADEMARK OFFICE
CERTIFICATE OF CORRECTION

PATENT NO. : 6,302,316 B1
DATED : October 16, 2001
INVENTOR(S) : Nobuaki Hayashi et al.

It is certified that error appears in the above-identified patent and that said Letters Patent is hereby corrected as shown below:

<u>Column 13, line 29, through column 14, line 5,</u>
Please replace claim 6 with the following claim 6:
     6.    A ball arrangement method for simultaneously mounting balls on a mounting object comprising:
        providing a ball arrangement device having ball suction holes, a flux supplying unit composed of a head plate having flux supplying nozzles arranged thereover at positions corresponding to said ball suction holes in said ball arrangement device;
        holding said balls by suction on said ball suction holes in said ball arrangement device;
        transcribing flux or a solder paste onto said balls held by suction by bringing said balls held by suction on said ball suction holes in said ball arrangement device into contact with said flux supplying nozzles, and then filling said flux or said solder paste into said flux supplying nozzles by supplying said flux or said solder paste from the inside of said head plate of said flux supplying unit; and
        transferring said balls onto said mounting object.

<u>Column 14,</u>
Lines 6-9, please replace claim 7 with the following claim 7:
     7.    The ball arrangement method according to claim 6, wherein said flux or said solder paste is filled into said flux supplying nozzles by a flux pressurizing unit provided on the back side of said head plate.
Lines 10-13, please replace claim 8 with the following claim 8:
     8.    The ball arrangement method according to claim 6, wherein the flux or the solder paste running over the upper surface of said head plate is wiped out by a squeegee.
Lines 14-16, please replace claim 9 with the following claim 9:
     9.    The ball arrangement method according to claim 6, wherein the flux or the solder paste running over the upper surface of said head plate is wiped out by a tape.
Lines 17-19, please replace claim 10 with the following claim 10:
     10.    The ball arrangement method according to claim 6, wherein the diameter of each of said flux supplying nozzles is in the range of 1/3 to 9/10 the diameter of said ball.
Lines 21-26, please replace claim 11 with the following claim 11:
     11.    The ball arrangement method according to claim 6, wherein, after said transcribing of said flux or said solder paste onto the surfaces of said balls, said transferring includes separating said balls from said head plate, and further comprising wiping out said flux or a solder paste running out of said flux supplying nozzles over the surface of said head plate.

UNITED STATES PATENT AND TRADEMARK OFFICE
CERTIFICATE OF CORRECTION

PATENT NO.     : 6,302,316 B1
DATED          : October 16, 2001
INVENTOR(S)    : Nobuaki Hayashi et al.

It is certified that error appears in the above-identified patent and that said Letters Patent is hereby corrected as shown below:

<u>Column 14 cont'd,</u>
Lines 27-30, please replace claim 12 with the following claim 12:
    12.    The ball arrangement method according to claim 11, wherein said flux or said solder paste is filled into said flux supplying nozzles by a flux pressurizing unit provided on the back side of said head plate.
Lines 31-34, please replace claim 13 with the following claim 13:
    13.    The ball arrangement method according to claim 11, wherein the flux or the solder paste running over the upper surface of said head plate is wiped out by a squeegee.
Lines 35-37, please replace claim 14 with the following claim 14:
    14.    The ball arrangement method according to claim 11, wherein the flux or the solder paste running over the upper surface of said head plate is wiped out by a tape.
Lines 38-40, please replace claim 15 with the following claim 15:
    15.    The ball arrangement method according to claim 11, wherein the diameter of each of said flux supplying nozzles is in the range of 1/3 to 9/10 the diameter of said ball.

Signed and Sealed this

Fifteenth Day of October, 2002

Attest:

Attesting Officer

JAMES E. ROGAN
*Director of the United States Patent and Trademark Office*